(12) United States Patent
Lin et al.

(10) Patent No.: US 7,435,355 B2
(45) Date of Patent: Oct. 14, 2008

(54) LIQUID-BASED GRAVITY-DRIVEN ETCHING-STOP TECHNIQUE FOR CONTROLLING STRUCTURE DIMENSION

(75) Inventors: Wei-Chin Lin, Hsinchu (TW); Hui-Ling Chang, Hsinchu (TW); Ching-Hsiang Tsai, Hsinchu (TW); Chao-Chiun Liang, Hsinchu (TW); Gen-Wen Hsieh, Hsinchu (TW); Yuh-Wen Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 314 days.

(21) Appl. No.: 11/242,866

(22) Filed: Oct. 5, 2005

(65) Prior Publication Data

US 2006/0264058 A1    Nov. 23, 2006

(30) Foreign Application Priority Data

May 20, 2005    (TW)    ............................... 94116609 A

(51) Int. Cl.
*B44C 1/22*    (2006.01)
*H01L 21/302*    (2006.01)

(52) U.S. Cl. ............................. 216/83; 216/2; 216/84; 438/745; 134/1.2; 134/2; 134/3

(58) Field of Classification Search ..................... 216/2, 216/83, 84; 438/745, 749; 134/1.3, 2, 3
See application file for complete search history.

(56) References Cited

U.S. PATENT DOCUMENTS

| | | | | |
|---|---|---|---|---|
| 4,469,554 A | * | 9/1984 | Turner | 216/97 |
| 6,203,660 B1 | * | 3/2001 | Unger et al. | 156/345.11 |
| 6,369,931 B1 | * | 4/2002 | Funk et al. | 359/223 |
| 6,939,408 B1 | * | 9/2005 | Abramovich et al. | 134/2 |
| 2005/0150280 A1 | * | 7/2005 | Tang et al. | 73/105 |

FOREIGN PATENT DOCUMENTS

DE    WO-2004068501    *    8/2004

* cited by examiner

*Primary Examiner*—Shamim Ahmed
(74) *Attorney, Agent, or Firm*—Harness Dickey & Pierce, P.L.C.

(57) ABSTRACT

A liquid-based gravity-driven etching-stop technique for controlling structure dimension is provided, where opposite etching trenches in cooperation with an etching-stop solution are used for controlling the dimension of a microstructure on the wafer level. In an embodiment, opposite trenches surrounding the microstructure are respectively etched on sides of the wafer, and the trench depth on the side of the wafer, on which the microstructure is, is equal to the design dimension of the microstructure. Contrarily, it is unnecessary to define the trench depth on the back-side of the chip. In the final step of the fabrication process, when the device is etched, such that the trenches on the sides communicate with each other to separate the microstructure from the whole wafer automatically and thereby shift from the etchant into the etching-stop solution to stop etching.

14 Claims, 3 Drawing Sheets

LIQUID-BASED GRAVITY-DRIVEN ETCHING-STOP TECHNIQUE FOR CONTROLLING STRUCTURE DIMENSION

CROSS REFERENCE TO RELATED APPLICATIONS

This Non-provisional application claims priority under 35 U.S.C. § 119(a) on Patent Application No(s). 94116609 filed in Taiwan on May 20, 2005, the entire contents of which are hereby incorporated by reference.

BACKGROUND

1. Field of Invention

The present invention relates to an etching-stop technique, and particularly to a liquid-based gravity-driven etching-stop technique for controlling a microstructure dimension of a device.

2. Related Art

With the increasing development of science and technology, the research tends towards the miniaturization, and the research and development of the Micro-ElectroMechanical System (MEMS) have been increased significantly. The microstructures produced by the MEMS technique include a micro sensor, a micro actuator, an atomic force probe, and the like, which can be used in various fields such as biological medicine, aerospace, electronics, and environmental engineering.

For the current technique for controlling the etching degree of a microstructure, such as the thickness of a cantilever beam or suspend membrane structure, the etching degree is conventionally measured by manually observing the images of the etched parts using a microscope or a scanning electronic microscope (SEM), and determining whether the etching degree is in accordance with the standard. Alternatively, the etching rate of the material used and its proper etchant is measured as the reference of the time required to carry out the etching. However, most of the above methods are using empirical value obtained as reference of the process, and it is difficult to control the etching thickness efficiently when etching the structure.

In order to actively control the thickness of a suspend membrane or cantilever beam structure, in the current microelectromechanical process, the ion implantation combined with electrochemical etching or a Silicon on isolation (SOI) is used for controlling, thus resulting in high manufacturing cost and technical difficulties.

Therefore, a method is developed to control the etching degree, in which etching trenches are made in a wafer. The etching trenches are portrayed previously around the device of the wafer to be etched, and then etched until they are etched through to drop the device, which is then taken out and washed. However, in this method, it is necessary to visually observe whether the device has fallen, and the device has to be taken out immediately. The etching is still continued during the time interval between taking-out and washing, therefore influencing the precision of the device.

SUMMARY

In this regard, the present invention provides a liquid-based gravity-driven etching-stop technique for controlling structure dimension, in which opposite trenches are made around the microstructure of the substrate to be etched, and at the same time, an etching control solution, having an etching region and an etching-stop region, is also used. Thus the microstructure can be separated automatically when reaching the required etching depth, and fall into the etching-stop region.

The liquid-based gravity-driven etching-stop technique for controlling a structure dimension is provided in the present invention. First, provide an etching control solution having an etchant and an etching-stop solution for controlling the structure dimension. Further, provide a substrate having a first surface and a second surface, wherein the first surface is provided with a microstructure and thickness control trenches surrounding the microstructure, and the second surface is provided with etching trenches opposite to the thickness control trenches. Then, place the substrate within the etchant. Following that, etch the substrate by the etchant, such that the etching trench of the substrate communicates with the thickness control trench, to separate the microstructure form the substrate and thereby shift into the etching-stop solution. Thus, the etching of the microstructure can be stopped automatically, and the depth of the thickness control trench is the desired thickness of the microstructure.

The control of the microstructure thickness can be achieved by using the etching control solution along with the opposite thickness control trenches and etching trenches. Further, the etching-stop solution stays below the etchant. That is, a density of the etching-stop solution is greater than the density of the etchant. Furthermore, the etching-stop solution is chemically inert to the substrate and the etchant.

Accordingly, since the thickness control trench has been preset to a desired thickness, when the substrate is etched by the etchant, such that the etching trench communicates with the opposite thickness control trench, the microstructure will be separated from the whole substrate automatically and fall into the etching-stop solution below the etchant. Thereby, the etching is stopped by the etching-stop solution, and the automatic control of the microstructure thickness can be achieved effectively.

Moreover, the substrate may comprise one or more microstructures surrounded by etch control trenches. Similarly, a plurality of microstructures can also be surrounded by a single etch control trench.

Furthermore, the etchant can be well temperature-controlled with the heating energy transmitted through the etching-stop solution and from the hot plate on the bottom. Accordingly, obvious density change of the etching-stop solution can not be subject to the external heating, either. Therefore, the etching rate can be controlled by temperature-control.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention will become more fully understood from the detailed description given herein below illustration only, and thus are not limitative of the present invention, and wherein.

DETAILED DESCRIPTION

In the liquid-based gravity-driven etching-stop technique for controlling a structure dimension of the present invention, opposite etching trenches and thickness control trenches are made around the microstructure to be etched, and at the same time, an etchant, having an etching region and an etching-stop region, is also used, so as to automatically control the structure thickness of the microstructure.

In an embodiment of the present invention, silicon is used as a substrate material to make a probe cantilever beam. The thickness control trench and the etching trench can be used to form a tapered trench by using a photolithography process, along with the characteristic that the etching rate of the potassium hydroxide solution is different on various crystal lattice surfaces of the silicon substrate material. For the fabrication of the thickness control trenches and the etching trenches on the surface of the silicon substrate respectively, references are made to FIG. 1A through FIG. 1E, which are the schematic sectional views of the flow of the method according to an embodiment of the present invention.

Figure 1A:
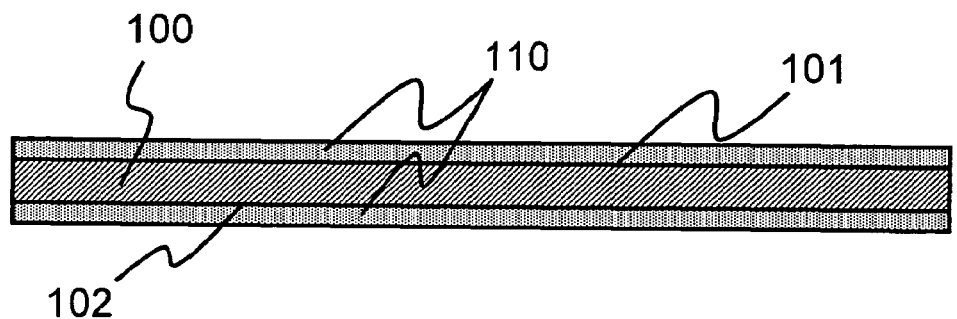
FIGS. 1A to 1E are schematic sectional views of the flow of the method according to an embodiment of the invention.

As shown in FIG. 1A, a silicon nitride ($Si_3N_4$) suspend membranes 110 is first deposited on a first surface 101 and a second surface 102 of a silicon substrate 100, by way of the Low Press Chemical Vapor Deposition (LPCVD), so as to be a hard mask in the subsequent process of etching the silicon substrate 100.

Figure 1B:
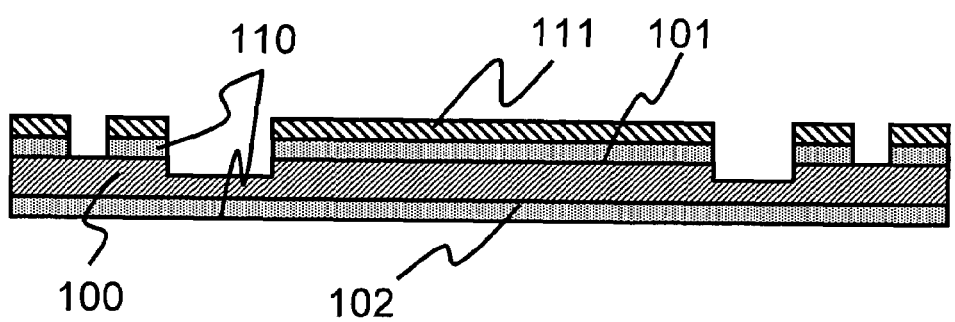

Then, as shown in FIG. 1B, a mask pattern is transferred to the $Si_3N_4$ suspend membrane 110. The surface of the $Si_3N_4$ suspend membrane 110 on the first surface 101 is coated with a photo resist layer 111 by using the photolithography processes including photo resist applying, exposing, etching etc., and is exposed with a mask, and then, the unmasked $Si_3N_4$ suspend membrane 110 is removed by the reactive ion etching (RIE).

Figure 1C:
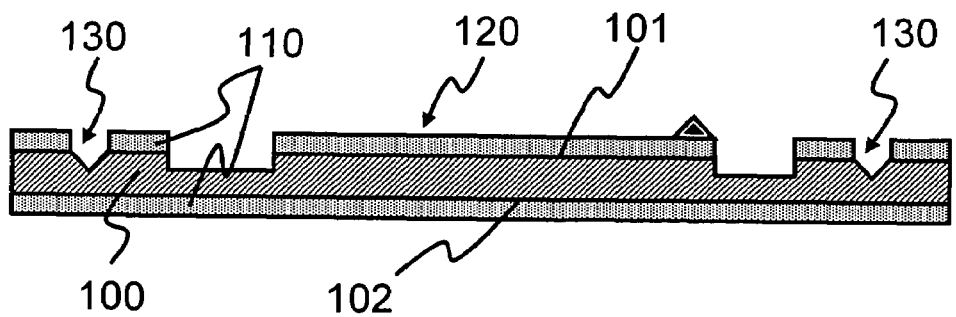

After the photo resist layer 111 is removed, as shown in FIG. 1C, the exposed silicon substrate 100 with the $Si_3N_4$ suspend membrane 110 as the hard mask is etched by using the KOH solution, so as to define a microstructure 120 and a thickness control trench 130 surrounding the microstructure 120. The microstructure 120 may comprise portions, such as a cantilever beam structure and probe of desired thickness. In addition, in order to avoid the influence of the subsequent processes, the surface of the microstructure 120 can be covered by a protective layer (not shown).

Figure 1D:
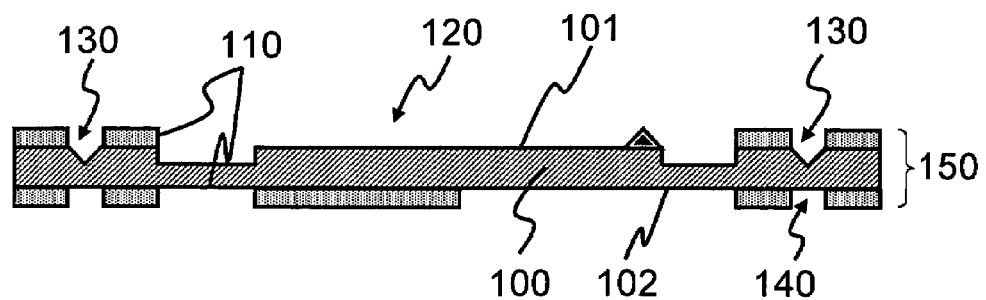

Similarly, the surface of the $Si_3N_4$ suspend membrane 110 on the second surface is coated with a photo resist layer by using the photolithography processes, and is exposed with a mask, and then, the unmasked $Si_3N_4$ suspend membrane is removed by RIE. As shown in FIG. 1D, etching trenches 140 opposite to the etch control trenches 130 are formed on the $Si_3N_4$ suspend membrane 110, thereby forming the structure of a substrate 150 according to the embodiment of the present invention. The substrate 150 comprises a first surface 101, having thickness control trenches 130 surrounding the microstructure 120, and a second surface 102, having etching trenches 140 opposite to the thickness control trenches 130, for implementing the subsequent etching processes for controlling a structure dimension. However, in the practical process, since it is unnecessary to define the depth of the etching trench 140 particularly, the etching trench 140 can also be first etched directly during the subsequent etching process for releasing the microstructure, and then be etched until it communicates with the etch control trench 130, such, that the microstructure 120 is separated from the silicon substrate 100, while the whole etching process for controlling a structure dimension is thus completed.

Figure 1E:
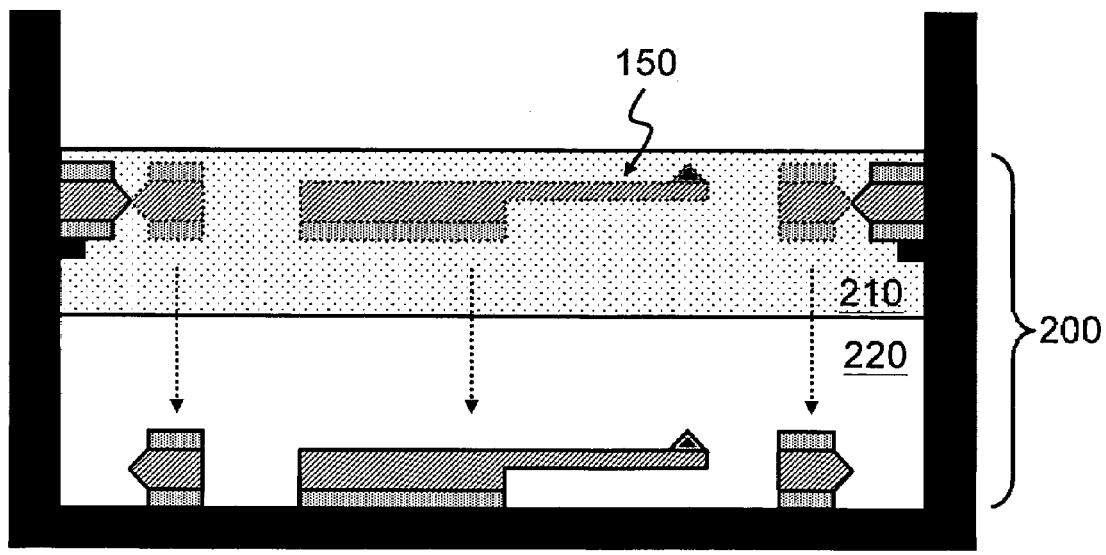

As shown in FIG. 1E, the etching control solution 200 comprises an etchant and an etching-stop solution, wherein the density of the etching-stop solution is greater than that of the etchant, such, that the etchant forms an etching region 210 above the etching-stop solution, while the etching-stop solution beneath the etchant forms an etching-stop region 220. Accordingly, the etching-stop solution must be chemically inert to both of the substrate 150 and the etchant. Therefore, the substrate 150 is placed in the etching region 210 and is etched to make the etching trenches 140 of the substrate 150 run through the thickness control trenches 130, thereby causing the microstructure 120 to be separated from the substrate 150 and fall from the etching region 210 into the etching-stop region 220. The etching of the microstructure 120 is thus stopped automatically. The depth of the thickness control trench 130 is the desired thickness of the microstructure 120.

Further, obvious density change of the etching-stop solution may not be subject to the external heating, such that the etchant can be well temperature-controlled with the heating energy transmitted through the etching-stop solution and from the hot plate on the bottom. Therefore, the etching rate can be controlled by temperature-control.

The above etchant may be an anisotropic etchant, for example, potassium hydroxide (KOH) and tetra-methyl-ammonium-hydroxide (TMAH), and the above etching-stop solution is, for example, diiodomethane ($CH_2I_2$).

Figure 2:
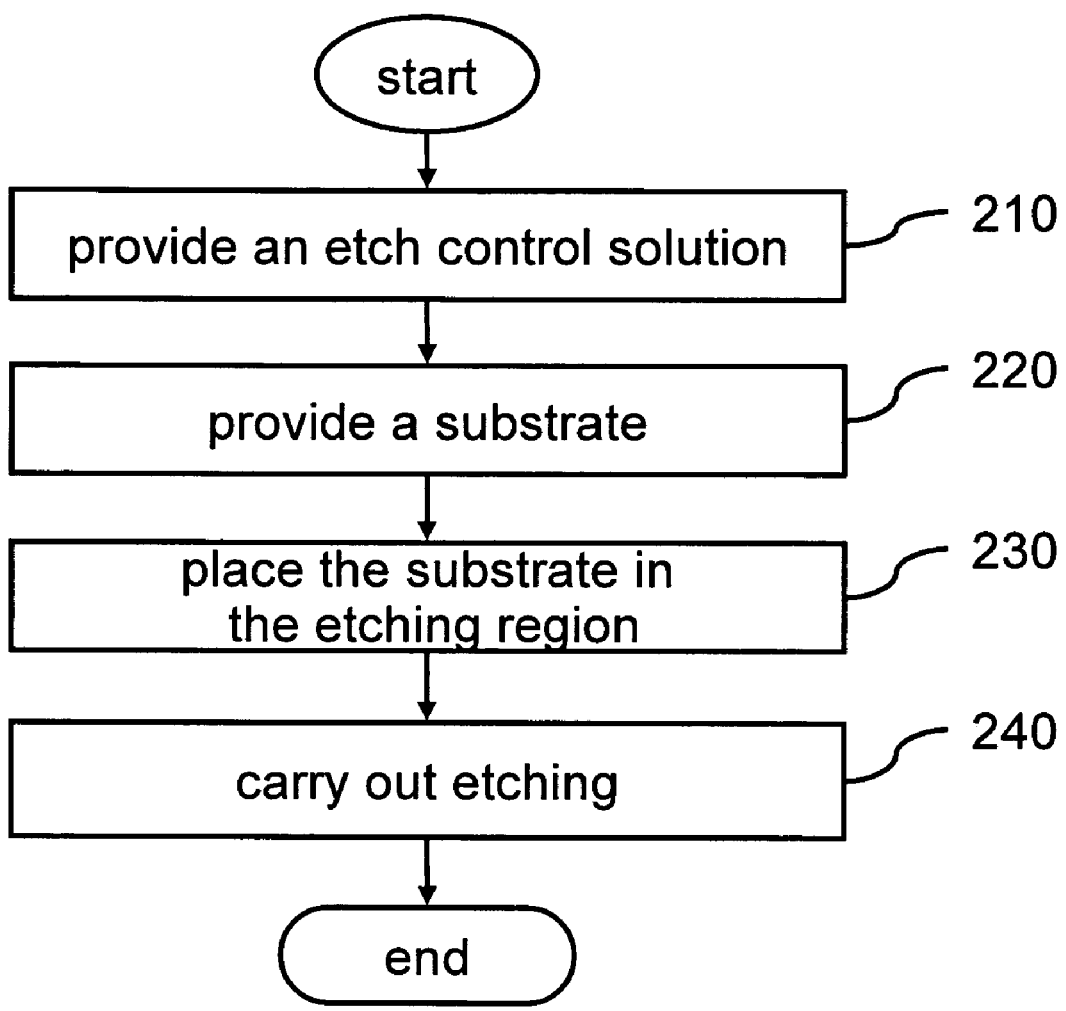
FIG. 2 is a flow chart of the steps of an embodiment of the invention.

An etching method for controlling a structure dimension disclosed in the embodiment of the present invention is shown in FIG. 2, which is a flow chart of the steps of the method of the embodiment of the present invention. The etching method comprises providing an etching control solution (step 210), having an etching region and an etching-stop region beneath it; providing a substrate (step 220), having opposite thickness control trenches and etching trenches; placing the substrate in the etching region (step 230); carrying out etching (step 240), such, that the etching trenches of the substrate communicate with the thickness control trenches, thereby causing the microstructure to be separated from the substrate and fall into the etching-stop region.

What is claimed is:

1. A liquid-based gravity-driven etching technique for controlling structure dimension, comprising the following steps:
   providing an etching control solution for controlling the structure dimension, wherein the etching control solution has an etchant and an etching-stop solution, the etchant and the etching-stop solution are immiscible, and the etching-stop solution stays below the etchant;
   providing a substrate having a first surface and a second surface, wherein the first surface has at least one microstructure and at least one thickness control trench surrounding the microstructure, and the second surface has at least one etching trench opposite to the thickness control trench;
   placing the substrate within the etchant; and
   etching the substrate by the etchant to communicate the etching trench with the thickness control trench, such that the microstructure is separated from the substrate, thereby falling from the etchant to the etching-stop solution.

2. The liquid-based gravity-driven etching technique for controlling structure dimension of claim 1, wherein a density of the etching-stop solution is greater than the density of the etchant.

3. The liquid-based gravity-driven etching technique for controlling structure dimension of claim 1, wherein the etching-stop solution is chemically inert to the substrate and the etchant.

4. The liquid-based gravity-driven etching technique for controlling structure dimension of claim 1, wherein the etchant is temperature-controlled with a heating energy transmitted through the etching-stop solution.

5. The liquid-based gravity-driven etching technique for controlling structure dimension of claim 4, wherein the heating energy is generated by a hot plate.

6. The liquid-based gravity-driven etching technique for controlling structure dimension of claim 1, wherein the etchant is a potassium hydroxide (KOH) solution.

7. The liquid-based gravity-driven etching technique for controlling structure dimension of claim 1, wherein the etchant is a tetra-methyl-ammonium-hydroxide (TMAH) solution.

8. The liquid-based gravity-driven etching technique for controlling structure dimension of claim 1, wherein the etching-stop solution is a diiodomethane solution.

9. The liquid-based gravity-driven etching technique for controlling structure dimension of claim 1, wherein a material of the substrate is silicon.

10. The liquid-based gravity-driven etching technique for controlling structure dimension of claim 9, wherein the etching-stop solution is chemically inert to the substrate.

11. The liquid-based gravity-driven etching technique for controlling structure dimension of claim 9, wherein a manufacture of the substrate comprises the following steps:

depositing a silicon nitride (Si3N4) suspend membrane on each of the first surface and the second surface to act as a hard mask;

patterning the hard mask of the first surface by a photolithography process;

etching the silicon substrate, to define the microstructure and the etch control trench on the first surface;

patterning the hard mask of the second surface by the photolithography process; and etching the silicon substrate, to define the etching trench on the second surface.

12. The liquid-based gravity-driven etching technique for controlling structure dimension of claim 11, wherein the step of etching the silicon substrate is implemented in a reactive ion etching.

13. The liquid-based gravity-driven etching technique for controlling structure dimension of claim 11, further comprising the step of forming a protective layer on a surface of the microstructure after the step of etching the silicon substrate.

14. The liquid-based gravity-driven etching technique for controlling structure dimension of claim 1, further comprising supporting the substrate within the etchant.

* * * * *